(12) United States Patent
Liang et al.

(10) Patent No.: US 9,275,741 B1
(45) Date of Patent: Mar. 1, 2016

(54) TEMPERATURE COMPENSATION MANAGEMENT IN SOLID-STATE MEMORY

(71) Applicant: Western Digital Technologies, Inc., Irvine, CA (US)

(72) Inventors: Guirong Liang, Santa Clara, CA (US); Haibo Li, Sunnyvale, CA (US); Dengtao Zhao, Santa Clara, CA (US); Yongke Sun, Pleasanton, CA (US); Kroum S. Stoev, Pleasanton, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/482,852

(22) Filed: Sep. 10, 2014

(51) Int. Cl.
| | |
|---|---|
| *G11C 16/10* | (2006.01) |
| *G11C 16/26* | (2006.01) |
| *G11C 16/34* | (2006.01) |
| *G11C 11/56* | (2006.01) |
| *G11C 16/04* | (2006.01) |
| *G11C 16/06* | (2006.01) |
| *G11C 7/04* | (2006.01) |
| *G11C 13/00* | (2006.01) |

(52) U.S. Cl.
CPC *G11C 16/10* (2013.01); *G11C 7/04* (2013.01); *G11C 11/5628* (2013.01); *G11C 13/0064* (2013.01); *G11C 13/0069* (2013.01); *G11C 16/0483* (2013.01); *G11C 2211/5621* (2013.01); *G11C 2211/5641* (2013.01)

(58) Field of Classification Search
CPC .............. G11C 11/5628; G11C 2211/5641; G11C 13/0064; G11C 16/10; G11C 7/04; G11C 16/0483; G11C 2211/5621; G11C 13/0069

USPC ............ 365/185.03, 185.22, 185.24, 185.28, 365/211
See application file for complete search history.

(56) References Cited

U.S. PATENT DOCUMENTS

| | | | |
|---|---|---|---|
| 5,982,663 A * | 11/1999 | Park ........................ | 365/185.09 |
| 6,856,556 B1 | 2/2005 | Hajeck | |
| 7,057,958 B2 | 6/2006 | So et al. | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,463,528 B2 | 12/2008 | Mokhlesi et al. | |
| 7,502,256 B2 | 3/2009 | Merry, Jr. et al. | |
| 7,509,441 B1 | 3/2009 | Merry et al. | |
| 7,583,535 B2 | 9/2009 | Sekar et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |

(Continued)

OTHER PUBLICATIONS

Dengtai Zhao, et al., U.S. Appl. No. 14/026,017, filed Sep. 13, 2013, 18 pages.

*Primary Examiner* — Ly D Pham

(57) ABSTRACT

Systems and methods are disclosed for programming data in a non-volatile memory array are disclosed. A data storage device includes a non-volatile memory array including a plurality of non-volatile memory cells and a controller configured to receive a signal indicating a temperature of at least a portion of the data storage device. The controller determines a first offset program verify level associated with a first programming level based at least in part on the temperature and programs a first set of the memory cells of the non-volatile memory array using the first offset program verify level.

16 Claims, 11 Drawing Sheets

(56) References Cited

U.S. PATENT DOCUMENTS

| | | |
|---|---|---|
| 7,765,373 B1 | 7/2010 | Merry et al. |
| 7,898,855 B2 | 3/2011 | Merry, Jr. et al. |
| 7,911,865 B2 | 3/2011 | Incarnati et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,213,255 B2 | 7/2012 | Hemink et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,472,274 B2 | 6/2013 | Fai et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,542,537 B2 | 9/2013 | Parker |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,755,233 B2 * | 6/2014 | Nagashima .............. 365/185.22 |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2009/0091979 A1 * | 4/2009 | Shalvi ...................... 365/185.09 |
| 2009/0290432 A1 * | 11/2009 | Park ......................... 365/185.25 |
| 2009/0310408 A1 * | 12/2009 | Lee et al. ................. 365/185.03 |
| 2010/0103726 A1 * | 4/2010 | Bae et al. ..................... 365/163 |
| 2010/0110815 A1 * | 5/2010 | Lee et al. ...................... 365/211 |
| 2010/0174849 A1 | 7/2010 | Walston et al. |
| 2010/0250793 A1 | 9/2010 | Syu |
| 2011/0099323 A1 | 4/2011 | Syu |
| 2011/0283049 A1 | 11/2011 | Kang et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0104955 A1 * | 4/2014 | Kwak et al. .............. 365/185.19 |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

PROGRAM VERIFY LEVELS

TEMPERATURE COMPENSATION MANAGEMENT IN SOLID-STATE MEMORY

BACKGROUND

1. Field

This disclosure relates to data storage systems. More particularly, the disclosure relates to systems and methods for programming solid-state memory cells.

2. Description of Related Art

Certain solid-state memory devices, such as flash drives, store information in an array of memory cells constructed with floating gate transistors. Endurance of solid-state memory cells can be affected by temperature, among other factors.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
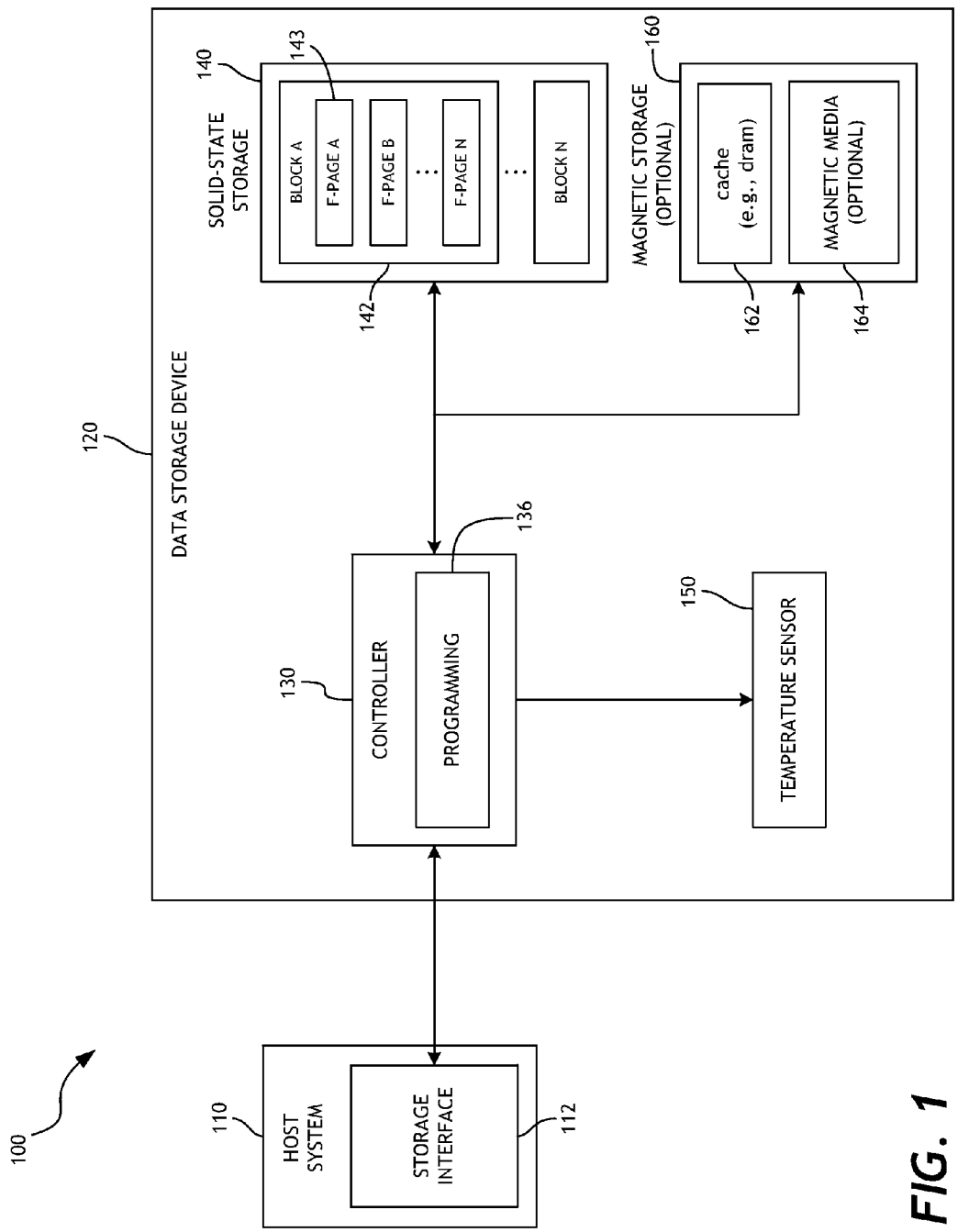
FIG. 1 is a block diagram representing a data storage system according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims.

Disclosed herein are example configurations and embodiments relating to controller board layouts in data storage systems.

TERMINOLOGY

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The term "page," or variations thereof, is used herein according to its broad and ordinary meaning. For example, "page" may refer to a block of a physical memory cells, or to the physical memory cells themselves. Furthermore, within a multi-level cell (MLC), "page" may refer to either of upper or lower pages, which may in tern be associated with most significant bits (MSB), least significant bits (LSB), or other programming mechanism or scheme.

Overview

The present disclosure provides systems and methods for programming solid-state memory devices, wherein temperature information is utilized in adjusting program verify and/or read levels in order to improve data endurance. Multi-level cell (MLC) solid-state memory (e.g., NAND flash) is used in various computing/data storage systems, such as solid-state memory cards and solid-state drives (SSD). As memory technology is increasingly down-sized, data retention and endurance can become increasingly critical specifications in solid-state devices. Various factors can affect data retention and endurance in solid-state drives. For example, when the environmental temperature is higher, program disturb (PD) may become worse, thereby negatively impacting data endurance.

To improve the solid-state memory endurance, various methods and mechanisms may be used, such as, for example, reduced step size for tighter programming state distribution, as well as different programming schemes, such as foggy-fine programming, and the like. However, such solutions may result in undesirably poor performance in, e.g., even page programming, and/or increased memory design complexity.

Certain embodiments disclosed herein provide systems and methods for temperature compensation management during data programming for improving MLC endurance in solid-state memory. In certain embodiments, a system temperature sensor is utilized for temperature compensation management during data programming. When a certain temperature criterion is met, the system may apply temperature compensation to the relevant program verify levels, wherein program verify levels for one or more programming states may be shifted by some amount in order to more evenly distribute the programming states, or margins therebetween, thereby improving memory endurance.

Temperature Compensation Storage System

FIG. 1 is a block diagram illustrating an embodiment of a combination of a host system 110 with a data storage device 120 incorporating temperature compensation functionality in accordance with embodiments disclosed herein. As shown, the data storage device 120 (e.g., hybrid hard drive, solid-state drive, any storage device utilizing solid-state memory, etc.) includes a controller 130 configured to receive data commands and execute such commands in a non-volatile solid-state memory array 140, which may include non-volatile solid-state memory cells. Such commands may include data read/write commands, and the like. The controller 130 may be configured to receive data commands from a storage interface (e.g., a device driver) 112 residing on a host system 110. Data commands may specify a block address in the data storage device 120; data may be accessed/transferred based on such commands.

The data storage device 120 can store data received from the host system 110 such that the data storage device 120 acts as data storage for the host system 110. To facilitate this function, the controller 130 may implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state storage 140 and/or other memory module(s). Mapping data indicating the mapping of logical addresses to physical memory addresses may be maintained in the data storage device. For example, mapping table data may be stored in non-volatile solid-state storage 140 in order to allow for recreation of mapping tables following a power cycle.

The controller 130 may include one or more memory modules (not shown), such as non-volatile memory (e.g., ROM) and/or volatile memory (e.g., RAM, such as DRAM). In certain embodiments, the controller 130 may be configured to store information, including, for example, operating system(s) code, application code, system tables and/or other data, in the non-volatile solid-state storage 140. On power-up, the controller 130 may be configured to load such data for use in operation of the data storage device.

The controller 130 may receive memory access commands from the host system, including programming commands, and implement such programming commands in the non-volatile memory array using a programming module 136. For example, the programming module 136 may implement a desirable programming scheme suitable for the non-volatile solid-state storage 140. In certain embodiments, the programming module 136 is configured to implement an MLC programming scheme, in which cells of solid-state memory are programmed to store a charge level representative of two or more bits of data. Such a programming scheme is described in further detail below with reference to FIG. 2.

Errors in solid-state memory can be caused by a number of conditions. For example, program disturb may result from memory cells not currently being programmed receiving elevated voltage stress, wherein charge may collect on the floating gate of solid-state transistors that causes the cells to appear to be programmed to some degree. Elevated temperature during programming may accelerate disturbance in neighboring cells, thereby increasing program disturb failures and ultimately resulting in higher raw bit-error-rate (RBER) and/or degradation of memory endurance.

In order to reduce the effects of temperature-related program disturb, the programming module 136 and/or other modules of the data storage device 120 may be configured to execute temperature compensation management in connection with the programming of the solid-state storage 140. Such temperature compensation may involve applying offset program verify levels based at least in part on temperature signals provided and/or generated by a temperature sensor module 150 of the data storage device 120. The temperature sensor 150 may be configured to detect temperature levels associated with at least a portion of the solid-state storage device and/or data storage device 120.

MLC Programming

Figure 2:
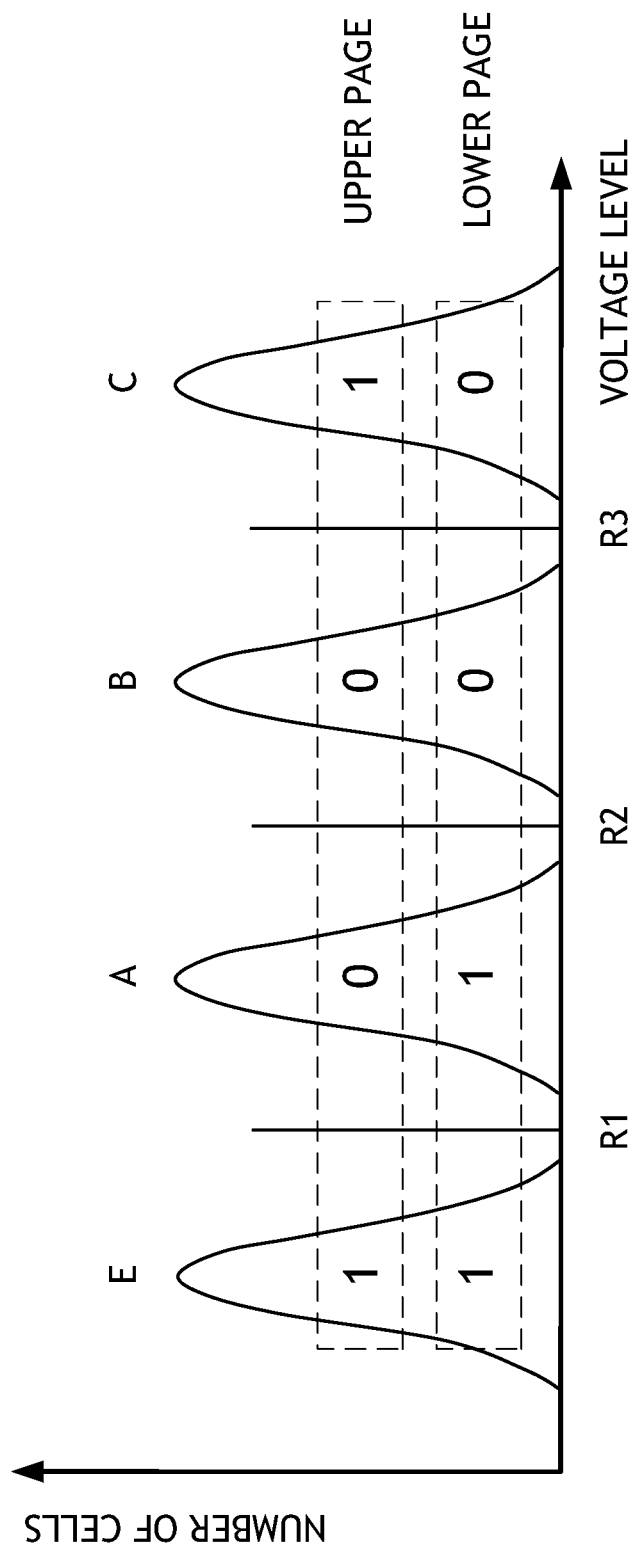
FIG. 2 is a graph showing a probability distribution of cells in a non-volatile memory array according to an embodiment.

FIG. 2 illustrates a graph showing a probability distribution of cells in a non-volatile memory array according to an embodiment. The distribution of FIG. 2 is associated with an MLC programming scheme, in which two bits of information are stored in a single memory cell. However, it should be understood that systems and methods disclosed herein may be utilized with respect to single-level cell (SLC) technology, or other technologies.

FIG. 2 shows four programming states: an erased state ('E'), and three programmed states ('A,' 'B,' 'C'), wherein each state represents two bits of data. In certain embodiments, the programming states each comprise a most-significant bit, referred to herein as the "upper page," and a least-significant bit, referred to herein as the "lower page." While particular coding values are assigned to the various states of the distribution (e.g., '11' for 'E,' '01' for 'A,' '00' for 'B,' and '10' for 'C'), other coding schemes may also be used within the scope of the present disclosure.

In decoding memory cells, one or more reference voltage levels, referred to herein as "voltage read levels," may be used to read the cells to determine what charge state the cells belong to. FIG. 2 illustrates three voltage read levels, R1, R2 and R3. In certain embodiments, lower page values may be determined based on a read at R2, while upper page values may be obtained by reading at R1 and/or R3.

Figure 3A:
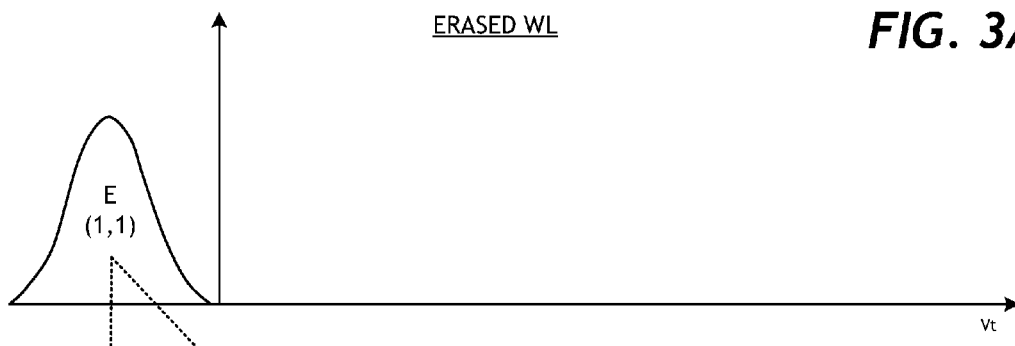
FIGS. 3A-3C illustrate probability distributions of cells at various stages of a programming process according to an embodiment.
Figure 3B:
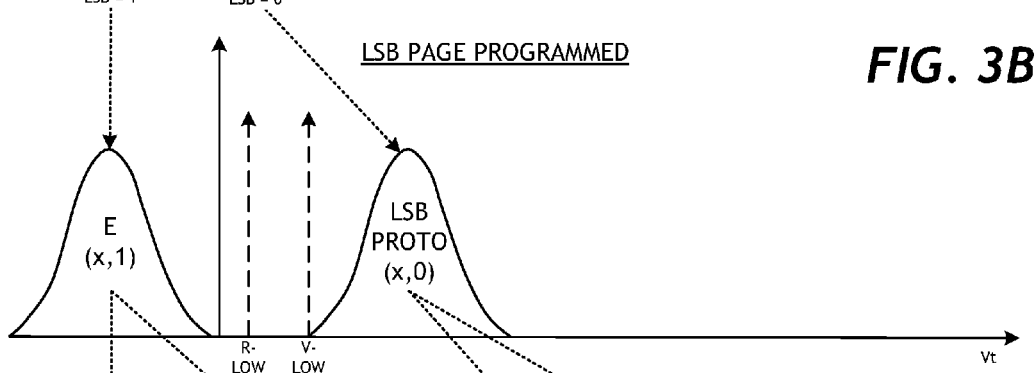
Figure 3C:
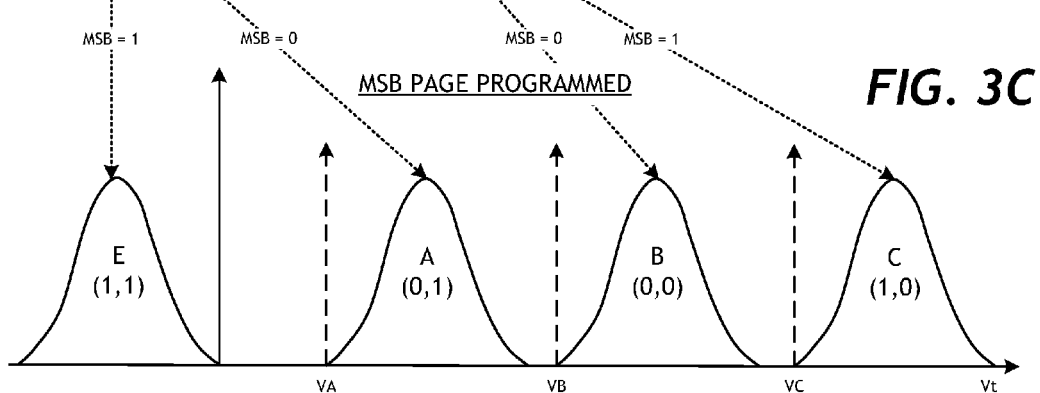

Programming in an MLC programming scheme may be performed in multiple stages. FIGS. 3A-3C illustrate probability distributions of cells at various stages of a programming process according to an embodiment. FIG. 3A illustrates a voltage distribution in which cells of a page of solid-state memory are in a first state, such as an erased state. In certain embodiments, cells are programmed from an erased state. Therefore, prior to programming, it may be necessary or desirable for a page of solid-state memory to be erased to allow for proper programming, as described herein.

In certain embodiments, MLC programming comprises two steps: in a first step, as illustrated in FIG. 3B, an LSB page may be programmed. For example, in an embodiment, for a cell having an LSB value of '1,' the cell may remain substantially in a low-voltage erased state, whereas a cell having an LSB value of '0' may be programmed above a higher program voltage level (V-Low). LSB page programming may be achieved by applying one or more programming pulses to the designated cells to push the programmed cells past the program verify level V-Low. Therefore, as illustrated, after LSB programming, the voltage distribution may comprise two separate states, which may be referred to as LSB intermediate, or "proto," states, or pages.

Following LSB programming, the MSB page may be programmed, as illustrated in FIG. 3C. Whereas the LSB page programming may result in division of cells into two intermediate voltage states (a first state corresponding to a lower level/state, such as an erased state, and a second state corresponding to a higher level/state), MSB programming may further divide the distribution into four states. For example, as states 'E' and 'A' both may correspond to an LSB value of '1,' in certain embodiments, the lower LSB proto page may be split into the 'E' and 'A' states, wherein allocation to 'E' and 'A' is determined by the relevant MSB value. In certain embodiments, where the MSB page is '1' (and LSB is '1'), cells may be permitted to remain in a lowest voltage state (e.g., erased state). Furthermore, where the MSB page is '0,' the cells may be programmed past a program verify level 'VA.' The margin between the 'E' and 'A' states may be determined at least in part by the position of program verify level VA. With respect to the cells corresponding to an LSB value of '0,' the MSB programming of such cells may be performed by programming cells having an MSB value of '0' past a program verify level 'VB' to a third voltage state 'B'. The margin between the 'A' and 'B' states may be determined at least in part by the position of program verify level VB. Furthermore, cells having an MSB value of '1' may be programmed from the higher LSB intermediate page past a program verify level 'VC' to a fourth voltage state 'C'.

Temperature Compensation

As discussed herein, in certain solid-state memory devices, such as NAND flash memory, device temperature can be a significant factor affecting program disturb and/or program state distribution, particularly after heavy program/erase (P/E) stress. More frequent occurrences of program disturb failures and/or wider program state distribution may degrade the memory endurance. The impact of temperature on program disturb occurrences and program state distributions is illustrated in some of the following figures.

Figure 4:
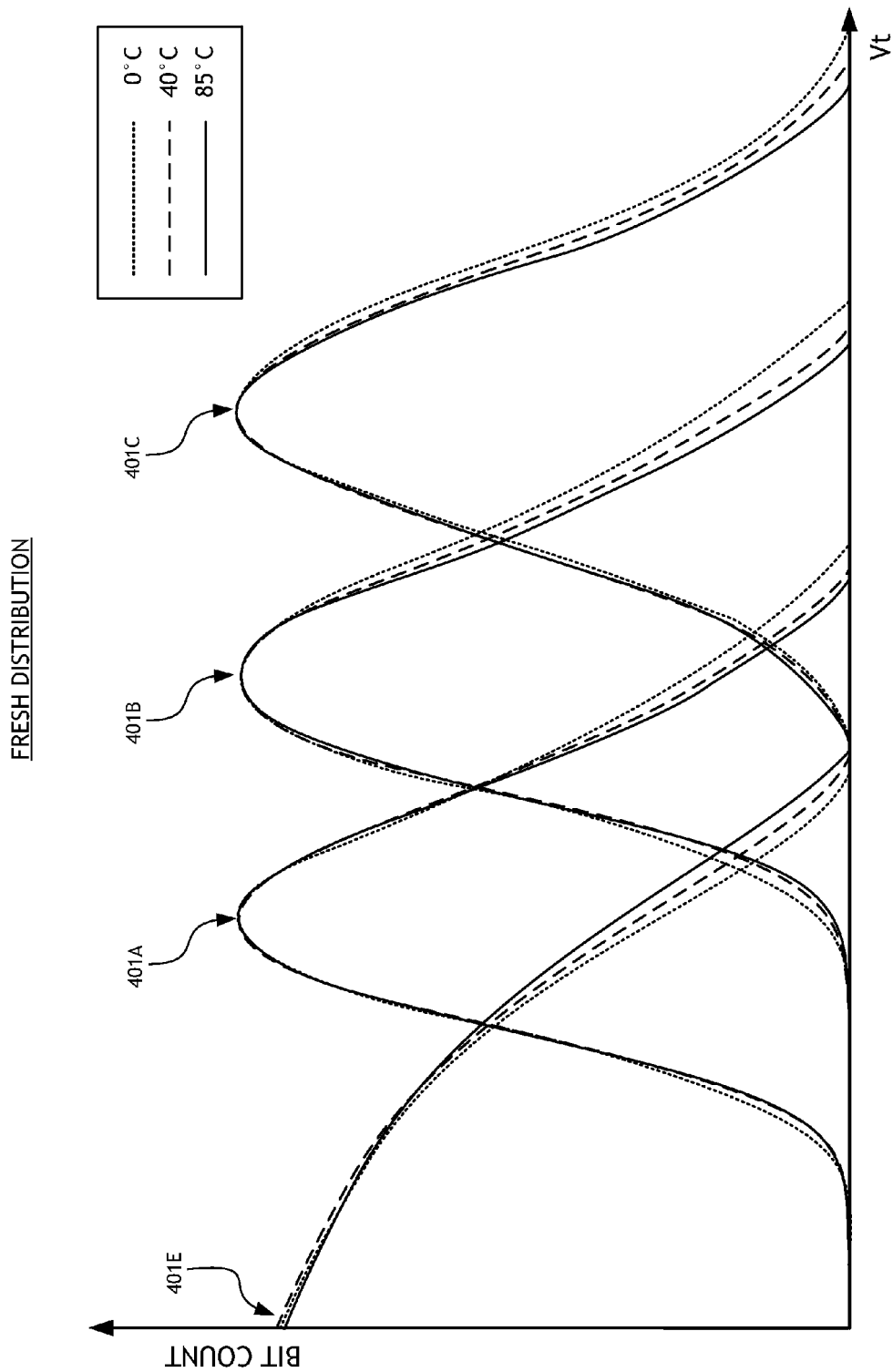
FIG. 4 is a graph showing probability distributions for cells in a non-volatile memory array according to one or more embodiments.
Figure 5:
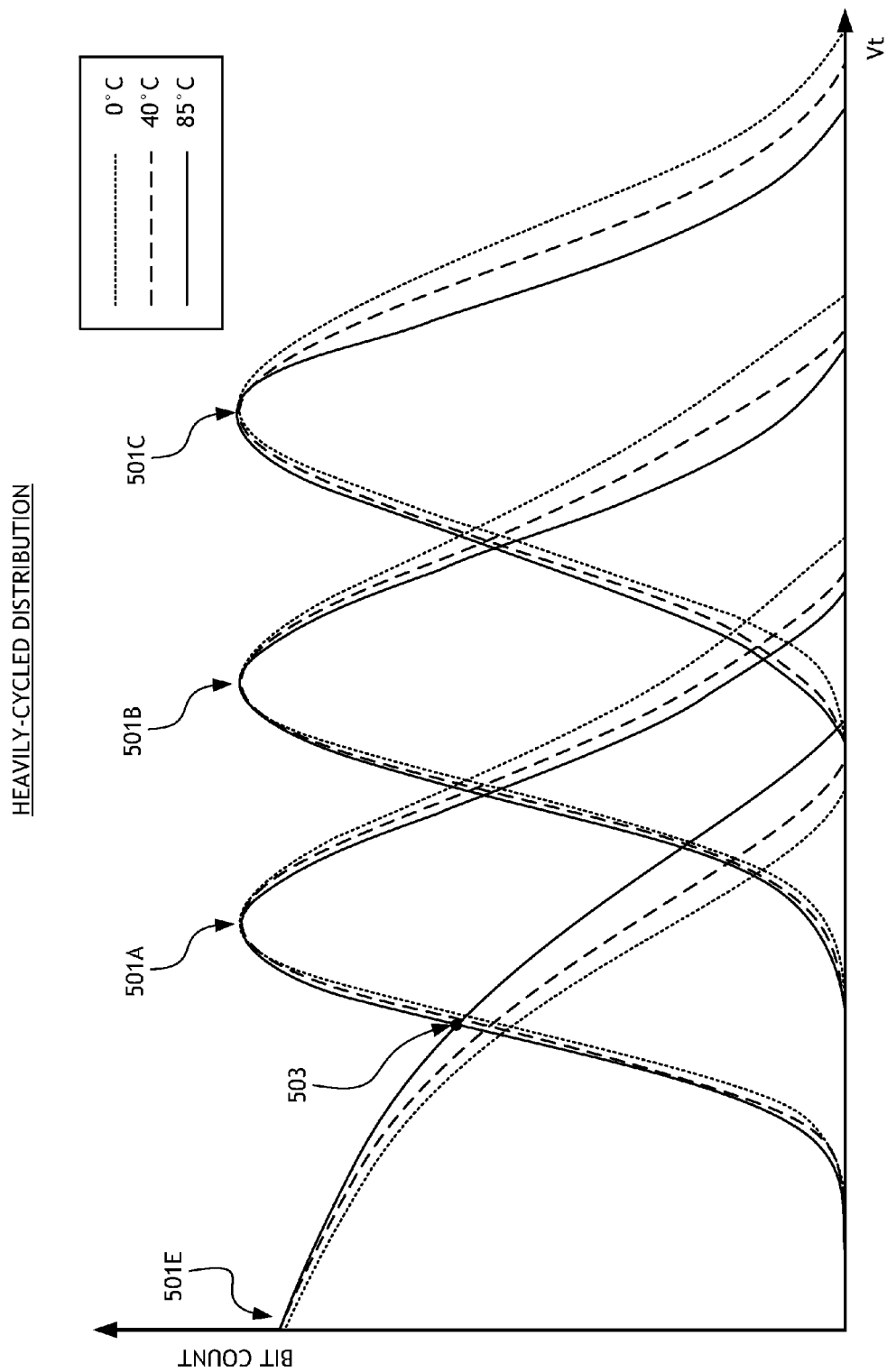
FIG. 5 is a graph showing probability distributions for cells in a non-volatile memory array according to one or more embodiments.

FIG. 4 is a graph showing probability distributions for cells in a non-volatile memory array according to one or more embodiments. The distributions of FIG. 4 may correspond to relatively-fresh distributions, wherein relatively few program/erase cycles and/or relatively short period of time has occurred since programming. The distribution includes a first state 401E, which may represent an erased state, and three additional programming states, 401A, 401B and 401C. The graph further illustrates distributions corresponding to three different temperature conditions, namely 0° C., 40° C. and 85° C., as identified, which may indicate a temperature associated with the programming of the memory cells. As shown, the distribution states may be relatively tight when the cells are freshly-programmed. Furthermore, the distribution associated with programming at relatively-higher temperature may be somewhat tighter for the 'A,' 'B' and/or 'C' states than at lower temperatures in certain embodiments. Such tightening of certain program state distributions at higher temperature may be at least partially attributable to a self-heating effect, wherein trapped charges may de-trap more easily at higher temperatures FIG. 5 is another graph showing probability distributions for cells in a non-volatile memory array according to one or more embodiments, wherein the represented memory cells have been subjected to a substantial number of program/erase cycles, such as at least 20,000, for example. FIG. 5 likewise shows distributions corresponding to different temperatures. The erased state is represented by the distribution 501E, while the subsequent programming states are represented by the distributions 501A, 501B and 501C. As shown in the graph of FIG. 5, in certain embodiments, the overlap between the erase state and the neighboring state 501A may be more significant at higher temperatures, as indicated by the intersection point 503, which may be higher and/or farther to the right than similar overlapping points for distributions at lower temperatures. Furthermore, as similarly shown in FIG. 4, the distributions for the higher states may be relatively tighter for higher temperatures. The increased overlap between the erased and neighboring state may result in an increase in bit error rate at increased temperatures.

Increased overlap between the erased and 'A' states at higher temperatures may result in a smaller margin between such states than exists between the 'B' and 'C' states and/or 'C' and 'D' states. In order to compensate for such uneven margins at higher temperatures, certain embodiments disclosed herein provide for offsetting of program verify levels and/or voltage read levels associated with one or more distributions, such as the 'A' state distribution and/or 'B' state distribution. For example, by offsetting such levels to the right (that is, in the positive voltage direction), the margins between the states may be evened out to some degree.

Figure 6:
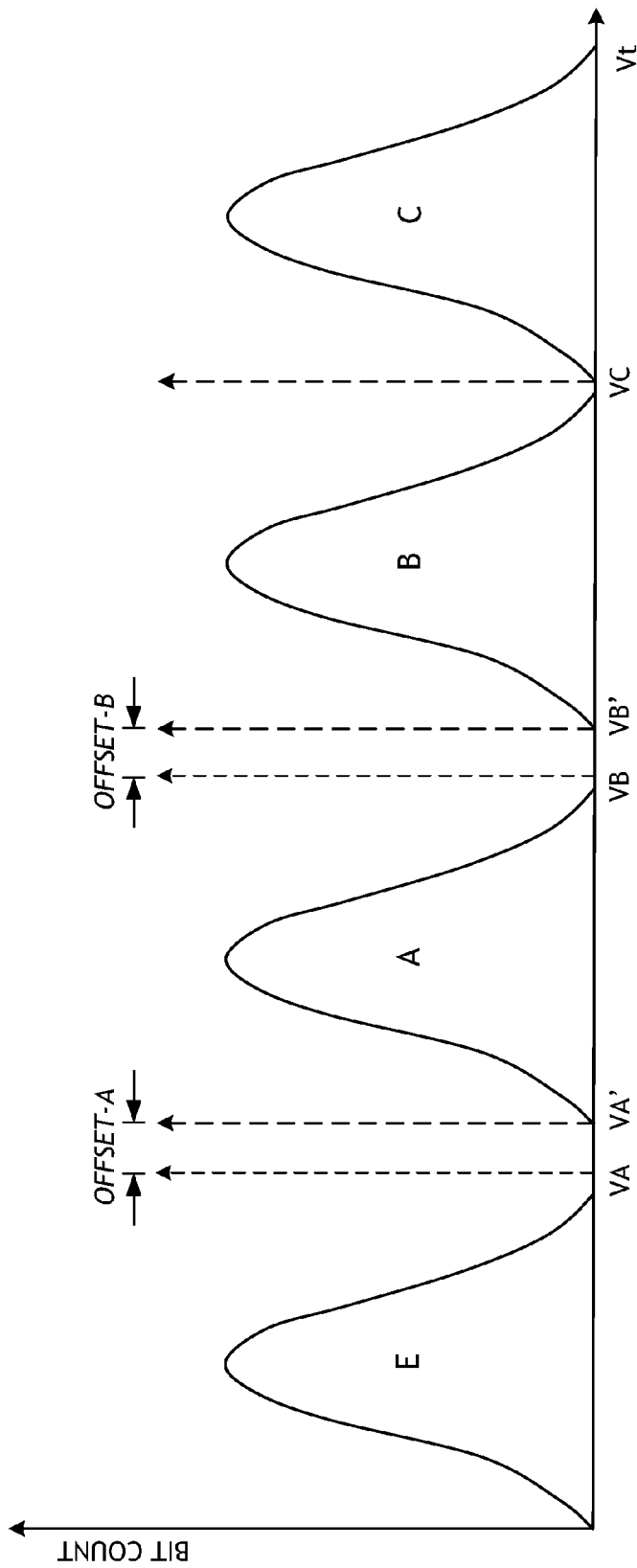
FIG. 6 is a graph showing a probability distribution of cells resulting from offset program verify levels according to an embodiment.

FIG. 6 is a graph showing a probability distribution of cells resulting from using offset program verify levels according to an embodiment. As shown, in certain embodiments, the program verify level VA may be shifted to the right (i.e., the positive voltage direction) by an offset value (Offset-A), resulting in a program verify level VA'. Compensating the voltage verify level VA' may help to more evenly distribute the margin between the states 'E' and 'A'. Furthermore, by offsetting the program verify level between the 'A' and 'B' states, the distribution of FIG. 6 may be further evened-out. In certain embodiments, the verify level offsets may be approximately halved in order to reduce bit error rates and improve MLC endurance at relatively high temperature. That is, the offset program verify levels may be selected such that the margins between the various programming states are nearly or substantially equal.

In certain embodiments, the program verify level associated with the farthest right distribution is not offset, or offset to a lesser degree than the other programming states. Such an offsetting scheme may advantageously result in improved bit error rates.

The offset values Offset-A and Offset B may be calculated or determined in any desirable manner, wherein such calculation or determination is based at least in part on the detected temperature associated with the relevant memory cells. In certain embodiments, a solid-state memory controller maintains a look-up table comprising program verify level offset values, or information indicative of the same, wherein the controller uses detected temperature values and/or program/erase cycling condition data in identifying and retrieving the offset program verify level(s). Furthermore, bit error rate information may additionally, or alternatively, be used to determine offset values. In certain embodiments, program verify offset values/levels may be determined based on substantially real-time calculations, wherein the program verify offset values/levels are a function of one or more of temperature, P/E count, bit error rate, or other factors.

In certain embodiments, in addition to program verify level offset, voltage read levels may also be offset to account for the offset program verify levels. For example, changing program verify levels may result in the system needing to perform read retry in order to find suitable read levels. In an embodiment, read levels are shifted by a factor of 0.5 compared to program verify level shift. That is, where program verify levels are shifted by 1 unit, read levels may be shifted by 0.5 units.

Systems not utilizing program verify level offsetting, as disclosed herein, may experience a greater number of error between the erased and 'A' states than between other states of the distribution. As described in detail below, using temperature compensation systems and methods disclosed here, and by taking advantages of tighter voltage distributions at high temperature, the upper page failure rate may be reduced compared to non-compensated high and low-temperature embodiments, and the lower page failures may be comparable to low-temperature embodiments.

Temperature Compensation Process

Certain embodiments disclosed herein provide a temperature compensation management mechanism for improving data endurance in a solid-state memory module by reducing the occurrences of decoding failure at high temperature. One example embodiment of a temperature compensation management process is described as follows: (1) The programming temperature is detected by an on-chip temperature sensor; (2) if the detected programming temperature is higher than certain criteria, such as 25° C. by a certain amount, then the programming of the solid-state memory module may be executed with temperature compensation on the 'A' state verify level (VA') and 'IT state verify level (VB'), as illustrated in FIG. 6. In certain embodiments, the verify levels for temperature compensation may be calculated as follows:

$$VA' = VA + \text{Offset-}A; \text{ and} \quad (1)$$

$$VB' = VB + \text{Offset-}B; \quad (2)$$

where Offset-A and Offset-B are the verify level offset for temperature compensation, depending on the detected temperature, and wherein VA and VB are the default program verify levels for the 'A' state and 'B' state, respectively. The verify level offset for temperature compensation at each different temperature, as well as P/E cycling condition, may be either a pre-determined value, or a variable value based on a function of the detected temperature.

Figure 7:
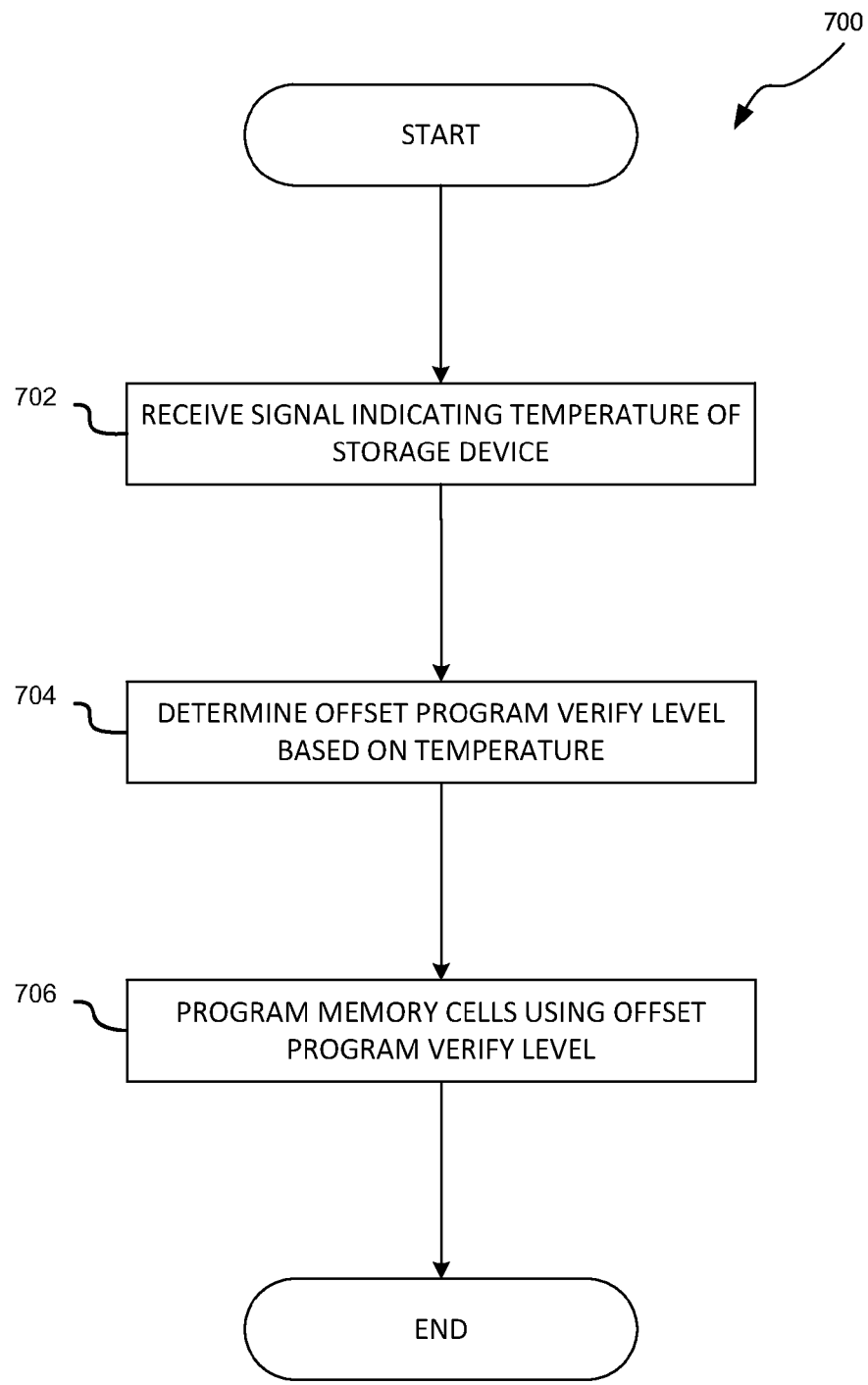
FIG. 7 is a flow diagram illustrating a temperature compensation process for solid-state memory according to an embodiment.

FIG. 7 is a flow diagram illustrating a temperature compensation process 700 for solid-state memory according to an embodiment. In certain embodiments, the process 700 involves receiving a signal indicating a temperature of a storage device, such as one or more NAND flash arrays at block 702. The temperature may be received from a temperature sensor disposed within or near the storage device, and the temperature sensor may be configured to provide temperature signals periodically, sporadically or continuously to a drive controller.

The process 700 involves determining one or more offset program verify levels based on the received temperature information at block 704. The offset program verify levels may be determined in any suitable or desirable manner. For example, the data storage device controller may maintain a table or other data structure that may be cross-referenced with current and/or historical temperature values, P/E cycle data, or other information. For example, when data is programmed in the device, the programming temperature and/or P/E cycle associated with the solid-state memory, or portion thereof, may be recorded in connection with such programming. In certain embodiments, the process 700 involves programming memory cells using the offset voltage verify level(s) at block 706.

Figure 8:
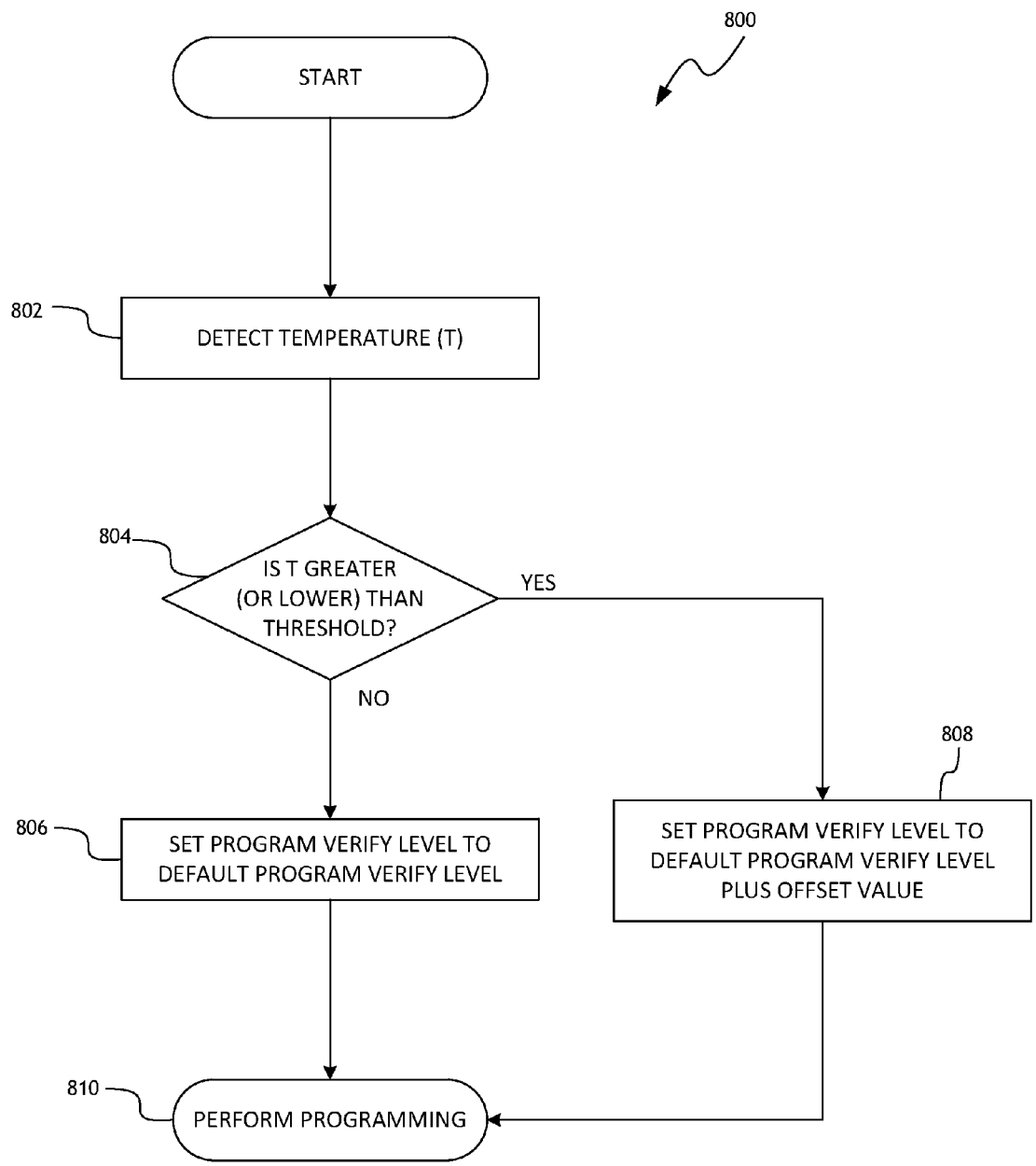
FIG. 8 is a flow diagram illustrating a temperature compensation process for solid-state memory according to an embodiment.

FIG. 8 is a flow diagram illustrating a temperature compensation process 800 for solid-state memory according to an embodiment. In certain embodiments, the process 800 involves detecting a temperature of one or more solid-state memory arrays, or portions thereof, at block 802. The process 800 further involves determining whether the detected temperature is greater than a predetermined threshold temperature value at decision block 804. In certain embodiments, the process 800 involves determining whether the detected temperature is less than a predetermined threshold temperature. For example, the threshold temperature may be selected to reflect a temperature above which data endurance is substantially affected negatively. The threshold temperature may be, for example, approximately 25° C., 30° C., 35° C., 40° C., or another value. If the temperature is not greater than the threshold temperature, the process 800 may involve programming memory cells of the one or more solid-state memory arrays using default program verify level(s), as shown at blocks 806 and 810.

If the temperature is greater than the threshold temperature, the process 800 may involve programming memory cells of the one or more solid-state memory arrays using offset program verify level(s), as shows at blocks 808 and 810. Furthermore, the process may involve reading memory cells from the one or more solid-state memory arrays using offset voltage read levels that reflect the offset program verify levels. In certain embodiments, the process 800 provides reduced bit error rate for solid-state memory programmed at relatively high temperature.

Effect of Temperature Compensation

Figure 9:
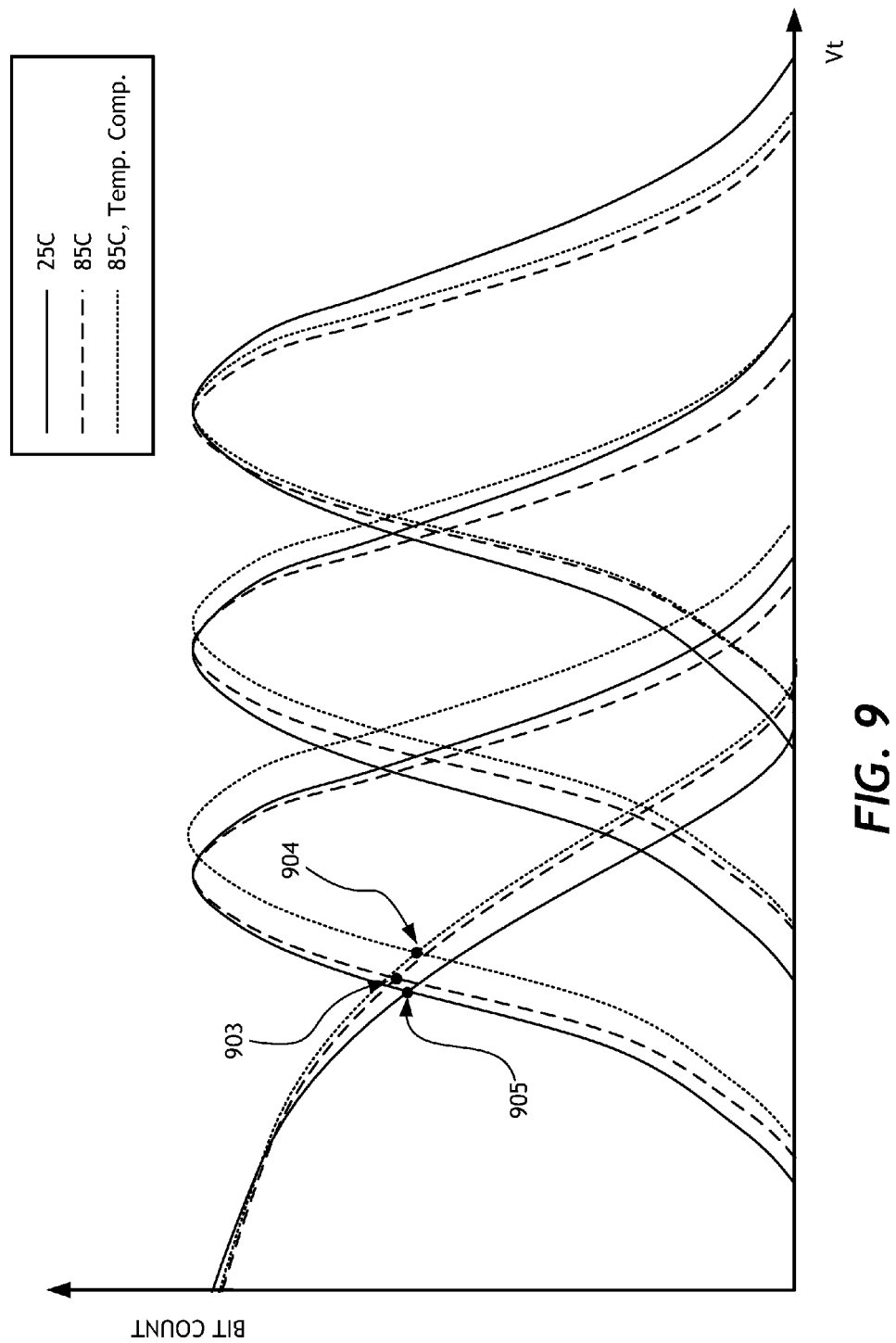
FIG. 9 is a graph showing probability distributions for cells in a non-volatile memory array according to one or more embodiments.

FIG. 9 is a graph showing probability distributions for cells in a non-volatile memory array according to one or more embodiments, wherein the distributions reflect programming using both offset and non-offset program verify levels. The illustrated distributions may represent memory cells having a P/E cycle count of approximately 20,000 or more, for example. The graph includes distributions at 25° C., 85° C. and 85° C. including temperature compensation as described herein. The bit error rate (RBER) of the various distributions may be correlated with the positions of the intersection points of neighboring programming states.

The temperature compensation curve may reflect program verify levels for states 'A' and/or 'B' that are shifted in the positive voltage direction by some amount. As shown, the intersection point 904 between the erased and 'A' states for the temperature compensation curve is at a lower point on the 'bit count' axis than the corresponding point 903 for the high-temperature non-compensation curve, thereby indicating a lower RBER for the temper compensation distribution. That is, at high temperature, with the temperature compensation management, the overall upper page read failures and RBER may be reduced because the 'A' state and 'B' state are programmed with higher verify levels so that the cross point of the erased state and 'A' state is lower. Because the margin between the erased and 'A' states is significant in upper page decoding, the shifting of the intersection point 904 downward can provide reduced error rate at higher temperature compared to non-compensated embodiments at lower temperatures as well as higher temperatures, is indicated by the relative position of the low-temperature non-compensated intersection point 905.

Furthermore, due to the tighter voltage distribution at high temperature, the higher verify levels with temperature compensation offset may allow for the 'A' state and 'B' state cross point, as well as the 'B' state and 'C' state cross point to be at similar levels as the lower-temperature (25° C.) distribution. Therefore, the lower page failures and RBER with temperature compensation may provide performance similar to that of cells exposed to a lower-temperature environment.

Based on the detected programming temperature, the temperature compensation management may be applied on the program verify levels by adding the temperature compensation offset to the trim, or default, verify levels. Through implementation of temperature compensation as disclosed herein, the bit error rate may be reduced, thereby improving the MLC endurance at high temperature.

Figure 10:
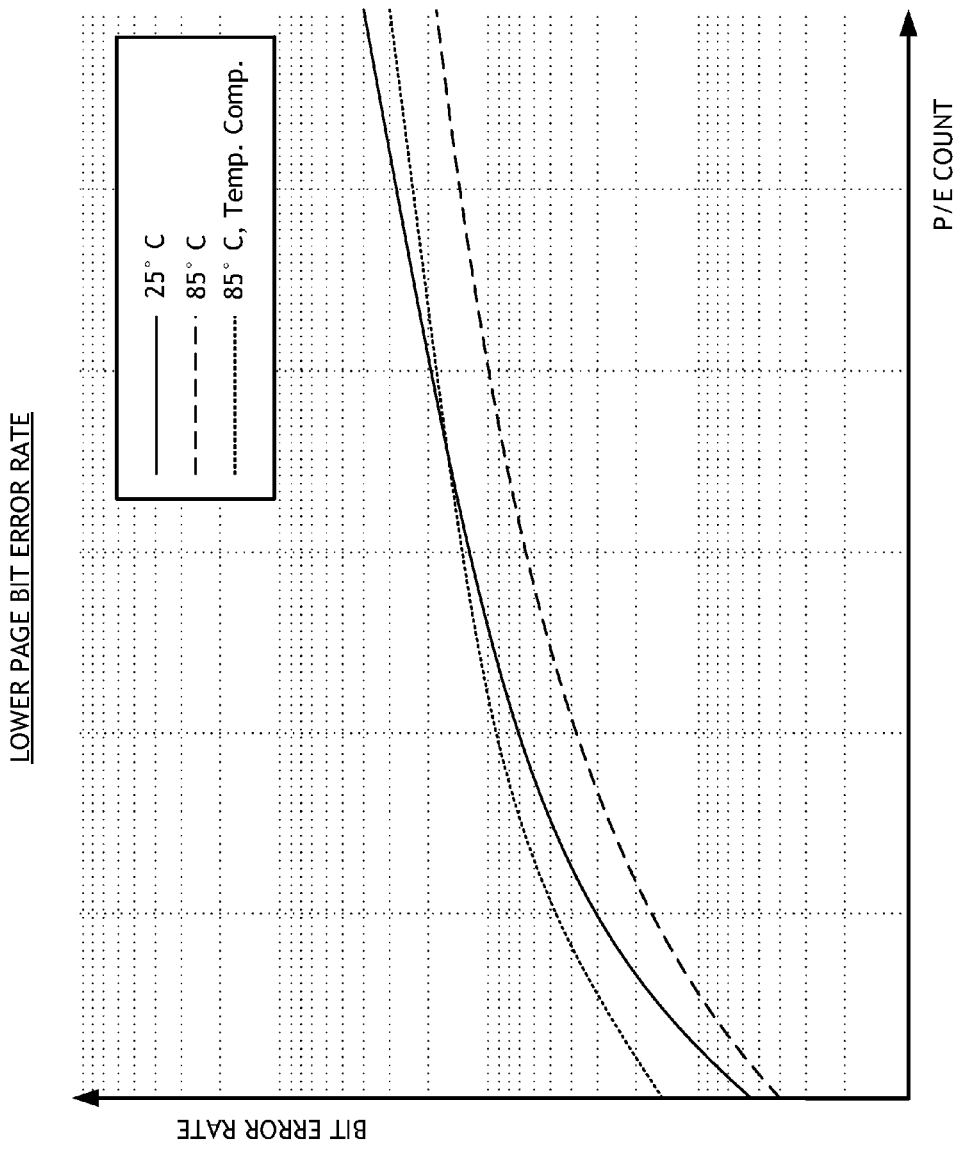
FIG. 10 is a graph showing examples of possible lower page bit error rates according to one or more embodiments.
Figure 11:
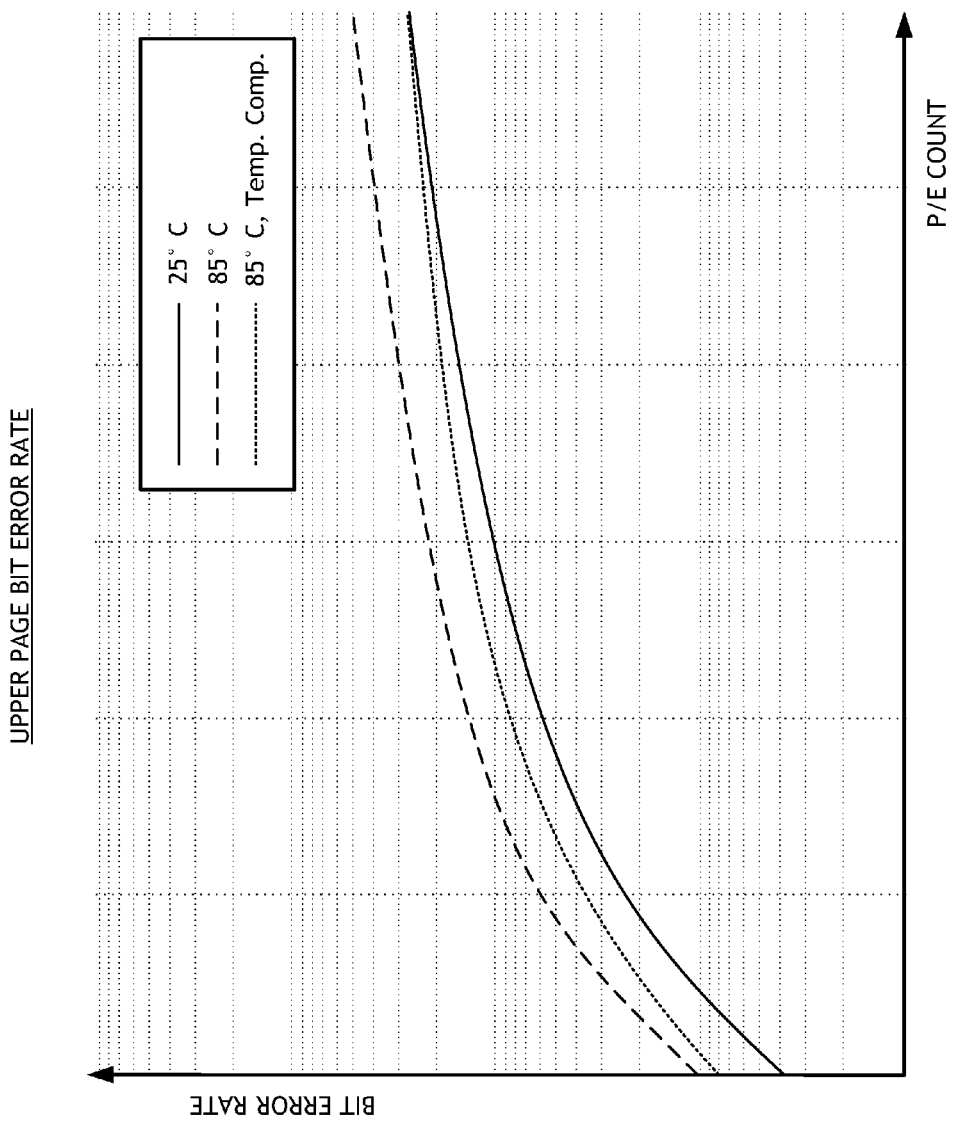
FIG. 11 is a graph showing examples of possible upper page bit error rates according to one or more embodiments.

FIGS. 10 and 11 show examples of possible relative lower page and upper page bit error rates for low-temperature non-compensated, high-temperature non-compensated and high-temperature compensated embodiments, respectively. As shown in FIG. 10, using temperature compensation at high temperature, bit error rates may be achievable for lower page decoding that are lower than low-temperature, non-compensated embodiments. Furthermore, as shown in FIG. 11, using temperature compensation at high temperature, bit error rates may be achievable for upper page that are lower than high-temperature non-compensated embodiments, and comparable with low-temperature non-compensated embodiments.

In certain embodiments, implementation of temperature compensation as described herein may provide an overall net improvement in bit error rate by a factor of approximately 0.2 or greater. Bit error rate performance may depend on P/E cycling. In certain embodiments, P/E count and temperature information are tracked using device firmware. The temperature compensation for different temperatures and different P/E cycle conditions can be characterized and optimized. Temperature compensation management may be implemented by the system whenever the temperature at programming can be detected and/or tracked.

ADDITIONAL EMBODIMENTS

Those skilled in the art will appreciate that in some embodiments, other types of temperature compensation systems can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
a non-volatile memory array including a plurality of non-volatile memory cells; and
a controller configured to:
receive a signal indicating a temperature of at least a portion of the data storage device;
determine a first offset program verify level associated with a first programming level based at least in part on the temperature;
determine a second offset program verify level associated with a second programming level based at least in part on the temperature;
program a first set of the memory cells of the non-volatile memory array using the first offset program verify level; and
program a second set of the memory cells of the non-volatile memory array using the second offset program verify level;
wherein the first and second offset program verify levels are determined to provide more even distribution of programming levels, thereby reducing an overall bit error rate associated with the non-volatile memory array.

2. The data storage device of claim 1, wherein the controller is further configured to program one or more of the memory cells using multi-level cell (MLC) programming.

3. The data storage device of claim 1, wherein said determining the first offset program verify level is based at least in part on a program/erase (P/E) count associated with the first set of memory cells.

4. The data storage device of claim 1, wherein said determining the first offset program verify level is based at least in part on a bit error rate associated with the first set of memory cells.

5. The data storage device of claim 1, wherein the first offset program verify level is determined by a real-time calculation based at least in part on the temperature.

6. A data storage device comprising:
a non-volatile memory array including a plurality of non-volatile memory cells; and
a controller configured to:
receive a signal indicating a temperature of at least a portion of the data storage device;
determine a first offset program verify level associated with a first programming level based at least in part on the temperature, said determining comprising adding an offset value to a default program verify level, the offset value being based at least in part on the temperature; and
program a first set of the memory cells of the non-volatile memory array using the first offset program verify level;
wherein the offset value is greater than zero when the temperature is greater than or equal to a first predetermined temperature threshold, and wherein the offset value is less than zero when the temperature is lower than a second predetermined temperature threshold.

7. The data storage device of claim 6, wherein the first predetermined temperature threshold is approximately 25° C.

8. A data storage device comprising:
a non-volatile memory array including a plurality of non-volatile memory cells; and
a controller configured to:
receive a signal indicating a temperature of at least a portion of the data storage device;
maintain a system table associating temperature values with program verify level offset values;
determine a first offset program verify level associated with a first programming level based at least in part on the temperature and the system table; and
program a first set of the memory cells of the non-volatile memory array using the first offset program verify level.

9. A data storage device comprising:
a non-volatile memory array including a plurality of non-volatile memory cells; and
a controller configured to:
- receive a signal indicating a temperature of at least a portion of the data storage device;
- determine a first offset program verify level associated with a first programming level based at least in part on the temperature;
- program a first set of the memory cells of the non-volatile memory array using the first offset program verify level;
- determine an offset voltage read level associated with the first programming level based at least in part on the temperature; and
- read a second set of the memory cells of the non-volatile memory array using the offset voltage read level.

10. A method of programming data in a data storage system comprising a non-volatile memory array, the method comprising:
- receiving a signal indicating a temperature of at least a portion of a data storage device;
- determining a first offset program verify level associated with a first programming level based at least in part on the temperature;
- programming a first set of memory cells of a non-volatile memory array of the data storage device using the first offset program verify level;
- determining an offset voltage read level associated with the first programming level based at least in part on the temperature; and
- reading a second set of the memory cells of the non-volatile memory array using the offset voltage read level;
- wherein the method is performed under the control of a controller of the data storage device.

11. The method of claim 10, further comprising:
- determining a second offset program verify level associated with a second programming level based at least in part on the temperature; and
- programming a third set of the memory cells of the non-volatile memory array using the second offset program verify level.

12. The method of claim 10, wherein said determining the first offset program verify level is based at least in part on a program/erase (P/E) count associated with the first set of memory cells.

13. The method of claim 10, wherein said determining the first offset program verify level is based at least in part on a bit error rate associated with the first set of memory cells.

14. The method of claim 10, wherein said determining the first offset program verify level comprises adding an offset value to a default program verify level, the offset value being based at least in part on the temperature.

15. The method of claim 10, further comprising maintaining a system table associating temperature values with program verify level offset values.

16. The method of claim 15, wherein said determining the first offset program verify level comprises referencing the system table.

* * * * *